(12) United States Patent
Teng et al.

(10) Patent No.: US 10,096,754 B2
(45) Date of Patent: Oct. 9, 2018

(54) SILICONE RESIN FILM, CURABLE SILICONE RESIN COMPOSITION, OPTICAL SEMICONDUCTOR DEVICE, AND PACKAGING METHOD FOR OPTICAL SEMICONDUCTOR DEVICE

(71) Applicant: BenQ Materials Corporation, Taoyuan (TW)

(72) Inventors: Shih-Chieh Teng, Taoyuan (TW); Ju-Hui Huang, Taoyuan (TW)

(73) Assignee: BenQ Materials Corporation, Taoyuan (TW)

(*) Notice: Subject to any disclaimer, the term of this patent is extended or adjusted under 35 U.S.C. 154(b) by 78 days.

(21) Appl. No.: 15/408,439

(22) Filed: Jan. 18, 2017

(65) Prior Publication Data

US 2018/0057714 A1  Mar. 1, 2018

(30) Foreign Application Priority Data

Aug. 31, 2016  (TW) .............................. 105128102 A

(51) Int. Cl.
*C09D 183/04* (2006.01)
*H01L 33/56* (2010.01)
*C08L 83/04* (2006.01)
*C09J 183/04* (2006.01)
(Continued)

(52) U.S. Cl.
CPC .............. *H01L 33/56* (2013.01); *C08L 83/04* (2013.01); *C09D 183/04* (2013.01); *C08G 77/12* (2013.01); *C08G 77/20* (2013.01); *C09J 183/04* (2013.01)

(58) Field of Classification Search
None
See application file for complete search history.

(56) References Cited

U.S. PATENT DOCUMENTS

2012/0153342 A1* 6/2012 Nishimura .............. C08L 83/04
257/99
2012/0319575 A1* 12/2012 Nakamura ............ H01L 33/505
313/512
(Continued)

FOREIGN PATENT DOCUMENTS

| CN | 103951984 A | 7/2014 |
| JP | 2010285593 A | 12/2010 |
| TW | 201536838 A | 10/2015 |

*Primary Examiner* — Robert S Loewe
(74) *Attorney, Agent, or Firm* — CKC & Partners Co., Ltd.

(57) ABSTRACT

The disclosure provides a silicone resin film comprising a release substrate and a silicone resin coating layer formed by coating a curable silicone resin composition on the release substrate and curing the curable silicon resin composition, wherein the silicone resin composition comprises 10 to 25 parts by weight of linear polysiloxane; 40 to 55 parts by weight of a first silicone resin wherein the first silicone resin have at least following siloxane units represented by the general formulas: $R^1SiO_{3/2}$ and a $R^2{}_2SiO_{2/2}$, wherein the molar fraction of $R^1SiO_{3/2}$ unit is present in the range of 0.60 to 0.75 in the general formula; 15 to 30 parts by weight of a second silicone resin; 15 to 25 parts by weight of a Si—H containing polysiloxane; a platinum group metal catalyst and phosphor powder.

14 Claims, 1 Drawing Sheet

(51) Int. Cl.
  *C08G 77/12* (2006.01)
  *C08G 77/20* (2006.01)

(56) References Cited

U.S. PATENT DOCUMENTS

| | | | |
|---|---|---|---|
| 2013/0009201 A1* | 1/2013 | Ko | C08L 83/04 257/100 |
| 2013/0092973 A1* | 4/2013 | Kondo | C08L 83/04 257/100 |
| 2014/0001949 A1* | 1/2014 | Kimura | H05B 33/10 313/498 |
| 2015/0267053 A1* | 9/2015 | Huang | C08L 83/04 257/100 |

* cited by examiner

SILICONE RESIN FILM, CURABLE SILICONE RESIN COMPOSITION, OPTICAL SEMICONDUCTOR DEVICE, AND PACKAGING METHOD FOR OPTICAL SEMICONDUCTOR DEVICE

PRIORITY DATA

This application claims priority to Taiwan Application Serial Number 105128102, filed Aug. 31, 2016, which is herein incorporated by reference.

BACKGROUND

Field of the Invention

The present disclosure is directed to a silicone resin film for encapsulating optical semiconductor devices and particularly a silicone resin film for encapsulating light emitting diode (LED) devices.

Description of Related Art

In the conventional light emitting diode (LED) dispensing packaging process or mold packaging process, the liquid encapsulant and the phosphor compound were mixed, dispensed or molded on the LED, and then cured to complete the LED chip packaging. The phosphor compound in the liquid encapsulant may be sedimented during these processing steps and resulted in the poor light efficiency or impure light color. Furthermore, in the LED dispensing or molding packaging process, the excitation lights emitted by the chips may be different in the light path passing through each phosphor compound particle, so that color shift may occur.

For improving the above-mentioned disadvantage and enhancing the package efficiency of LED, it is proposed that a silicone resin film comprising phosphor compound has been on the market. The silicone resin film is manufactured by mixing a phosphor compound and a silicone resin to form a film. When packaging LED, the silicone resin film is placed on the optical semiconductor chip, thermally pressed, and then customizedly cutting the chip to complete the LED package.

SUMMARY

One aspect of the present disclosure is to provide a silicone resin film. The silicone resin film has efficient thermal softening property in order to fully encapsulate the LED chip without gas trapped after the film is thermally pressed on the chip. The present film will not stick to the manufacturing machine. Furthermore, the silicone resin film has good hardness to prevent the chip from being damaged or fractured when cutting. Thus, the manufacture process is enhanced.

The present disclosure provides a silicone resin film comprising a release substrate and a silicone resin coating layer. The silicone resin film is manufactured by coating a curable silicone resin composition on the release substrate and curing the curable silicon resin composition, wherein the curable composition comprising 10 to 25 parts by weight of a linear polysiloxane, the average composition formula of the linear polysiloxane having at least one aryl group bonded to a silicon atom and two alkenyl groups bonded to a silicon atom; 40 to 55 parts by weight of a first silicone resin, wherein the average composition formula of the first silicone resin comprises at least a $R^1SiO_{3/2}$ unit and a $R^2_2SiO_{2/2}$ unit, wherein $R^1$ and $R^2$ are independently substituted or unsubstituted alkyl groups, substituted or unsubstituted alkenyl groups or substituted or unsubstituted aryl groups, the molar fraction of $R^1SiCO_{3/2}$ unit is between 0.60 to 0.75 in the average composition formula of the first silicone resin, the molar ratio of the alkenyl groups bonded to the silicon atoms to all the functional groups bonded to silicon atoms is between 0.03 to 0.15; 15 to 30 parts by weight of a second silicone resin, wherein the average composition formula of the second silicone resin comprises at least a $R^3SiO_{3/2}$ unit and $R^4_3SiO_{1/2}$ unit, wherein $R^3$ and $R^4$ independently are substituted or unsubstituted alkyl groups, substituted or unsubstituted alkenyl groups or substituted or unsubstituted aryl groups; 15 to 25 parts by weight of polysiloxane having silicon-hydrogen bonding of the formula: $HR^5_2SiO(SiR^6_2O)_nSiR^5_2H$, wherein $R^5$ is a substituted or unsubstituted alkyl group or hydrogen, $R^6$ is a substituted or unsubstituted aryl group, or a substituted or unsubstituted alkyl group, n is an integer more than 0; a platinum group metal catalyst and a phosphor compound.

In accordance with an embodiment of the silicone resin film of the present disclosure, in the average composition formula of the linear polysiloxane in the curable silicone resin composition, the molar ratio of the aryl groups bonded to silicon atoms to the all functional groups bonded to the silicon atoms, excluding the end-cap functional groups, is at least 0.4.

In accordance with an embodiment of the silicone resin film of the present disclosure, in the average composition formula of the first silicone resin in the curable silicone resin composition, the molar ratio of tire aryl groups bonded to silicon atoms to the all functional groups bonded to the silicon atoms, excluding the end-cap functional groups, is at least 0.48.

In accordance with an embodiment of the silicone resin film of the present disclosure, in the average composition formula of the second silicone resin in the curable silicone resin composition, the molar ratio of the aryl groups bonded to silicon atoms to the all functional groups bonded to the silicon atoms, excluding the end-cap functional groups, is at least 0.25.

In accordance with an embodiment of the silicone resin film of the present disclosure, the curable silicone resin composition comprises 1 ppm to 50 ppm of platinum group metal catalyst per 100 parts by weight of the total amount of the linear polysiloxane, the first silicone resin, the second silicone resin and the silicon-hydrogen-bonding containing polysiloxane.

In accordance with an embodiment of the silicone resin film of the present disclosure, the curable silicone resin composition comprises 1 to 300 parts by weight of the phosphor compound per 100 parts by weight of the total amount of the linear polysiloxane, the first silicone resin, the second silicone resin and the silicon-hydrogen-bonding containing polysiloxane.

In accordance with an embodiment of the silicone resin film of the present disclosure, the curable silicone resin composition can further comprises an bonding agent, an inhibitor, a thixotropic agent an anti-settling agent, inorganic fillers or the combinations thereof.

In accordance with an embodiment of the silicone resin film of the present disclosure, the inorganic filler used in the curable silicone resin composition can be, for example, fumed silica.

In accordance with an embodiment of the silicone resin film of the present disclosure, the additional amount of fumed silica is 0.1 to 5 parts by weight based on 100 parts by weight of the total amount of the linear polysiloxane, the first silicone resin, the second silicone resin and the silicon-hydrogen-bonding containing polysiloxane.

In the present disclosure, the loss modulus/storage modulus is represented as tan δ. Thus, in accordance with an embodiment of the present disclosure, the maximum tan δ of the silicone resin film at the temperature of 100° C. to 160° C. is between 0.5 to 2.5.

In accordance with an embodiment of the present disclosure, the minimum storage modulus (G') of the silicone resin film at the temperature of 100° C. to 160° C. is $1.0 \times 10^2$ to $9.9 \times 10^4$.

In accordance with an embodiment of the silicone resin film of the present disclosure, the time for curing the silicone resin coating at the temperature of 80° C. to 140° C. is 10 minutes to 100 minutes.

According to another aspect of the present disclosure, an optical semiconductor device is provided, wherein the semiconductor device is encapsulated by the silicone resin film of the present disclosure.

According to a further aspect of the present disclosure, a method for encapsulating optical semiconductor devices is provided, wherein the method comprises the steps of placing the silicone resin film on a semiconductor device, thermal compressing the film and device, and peeling away the release substrate.

The present disclosure provides a curable silicone resin composition comprising 10 to 25 parts by weight of the linear polysiloxane, the average composition formula of the linear polysiloxane having at least one aryl group-bonded to a silicon atom and two alkenyl groups bonded to a silicon atom; 40 to 55 parts by weight of a first silicone resin, wherein the average composition formula of the first silicone resin comprises at least a $R^1SiCO_{3/2}$ unit and a $R^2_2SiO_{2/2}$ unit, wherein $R^1$ and $R^2$ are independently substituted or unsubstituted alkyl groups, substituted or unsubstituted alkenyl groups or substituted or unsubstituted aryl groups, the molar fraction of $R^1SiO_{3/2}$ unit is between 0.60 to 0.75 in the average composition formula of the first silicone resin, the molar ratio of the alkenyl groups bonded to the silicon atoms to all the functional groups bonded to silicon atoms is between 0.03 to 0.15:15 to 30 parts by weight of a second silicone resin, wherein the average composition formula of the second silicone resin comprises at least a $R^3SiO_{3/2}$ unit and $R^4_3SiO_{1/2}$ unit, wherein $R^3$ and $R^4$ independently are substituted or unsubstituted alkyl groups, substituted or unsubstituted alkenyl groups or substituted or unsubstituted aryl groups; 15 to 25 parts by weight of polysiloxane having silicon-hydrogen bonding of the formula: $HR^5_2SiO(SiR^6_2O)_nSiR^5_2H$, wherein $R^5$ is a substituted or unsubstituted alkyl group or hydrogen, $R^6$ is a substituted or unsubstituted aryl group, or a substituted or unsubstituted alkyl group, n is an integer more than 0; a platinum group metal catalyst and a phosphor compound.

In accordance with an embodiment of the silicone resin composition of the present disclosure, the curable silicone resin composition further comprises a bonding agent, an inhibitor, a thixotropic agent, an anti-settling agent, inorganic fillers and the combinations thereof.

Furthermore, the present disclosure provides an optical semiconductor device, wherein the optical semiconductor device is encapsulated by the curable silicone resin composition of the present disclosure.

BRIEF DESCRIPTION OF THE DRAWINGS

The disclosure cars be more fully understood by reading the following detailed description of the embodiment, with reference made to the accompanying drawings as follows.

DETAILED DESCRIPTION

Figure 1:
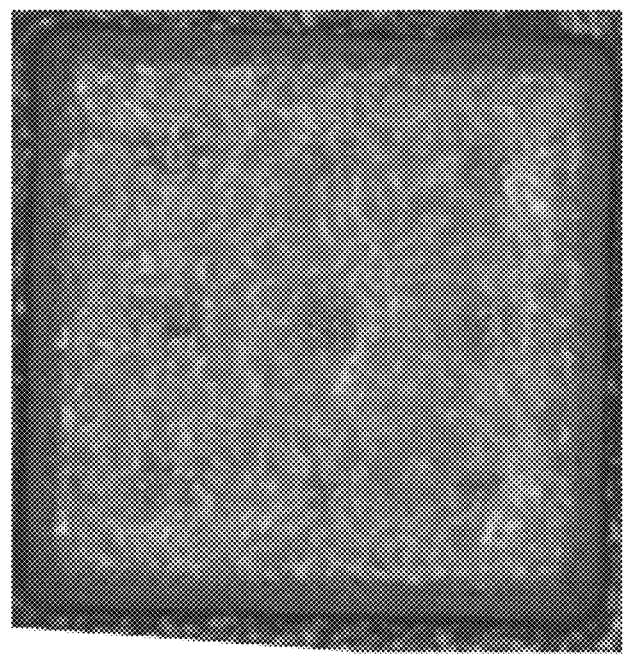
FIG. 1 is a top view optical-microscope image of a semiconductor device encapsulated by the silicone resin film obtained in Example 1.

Reference will now be made in detail to the present embodiments of the disclosure, examples of which are illustrated hi the accompanying drawings. Wherever possible, the same reference numbers are used in the drawings and the description to refer to the same or like parts.

The present disclosure provides a silicone resin film. The present silicon resin film comprises a release substrate and a silicone resin coating. The silicone resin film is manufactured by coating a curable silicone resin composition on the release substrate and curing the curable silicon resin composition, wherein the curable composition comprises 10 to 25 parts by weight of a linear polysiloxane, the average composition formula of the linear polysiloxane having at least one aryl group bonded to a silicon atom and two alkenyl groups bonded to a silicon atom; 40 to 55 parts by weight of a first silicone resin, wherein the average composition formula of the first silicone resin comprises at least a $R^1SiO_{3/2}$ unit and a $R^2_2SiO_{2/2}$ unit, wherein $R^1$ and $R^2$ are independently substituted or unsubstituted alkyl groups, substituted or unsubstituted alkenyl groups or substituted or unsubstituted aryl groups, the molar fraction of $R^1SiO_{3/2}$ unit is between 0.60 to 0.75 in the average composition formula of the first silicone resin, the molar ratio of the alkenyl groups bonded to die silicon atoms to all the functional groups bonded to silicon atoms is ranged between 0.03 to 0.15; 15 to 30 parts by weight of a second silicone resin, wherein the average composition formula of the second silicone resin comprises at least a $R^3SiO_{3/2}$ unit and $R^4_3SiO_{1/2}$ unit, wherein $R^3$ and $R^4$ independently are substituted or unsubstituted alkyl groups, substituted or unsubstituted alkenyl groups or substituted or unsubstituted aryl groups; 15 to 25 parts by weight of polysiloxane having silicon-hydrogen bonding of the formula: $HR^5_2SiO(SiR^6_2O)_nSiR^5_2H$, wherein $R^5$ is a substituted or unsubstituted alkyl group or hydrogen, $R^6$ is a substituted or unsubstituted aryl group, or a substituted or unsubstituted alkyl group, n is an integer more than 0; a platinum group metal catalyst and a phosphor compound.

The present curable silicone resin composition for manufacturing the silicone resin film comprises the first silicone resin with a specific addition amount of the $R^3SiO_{3/2}$ unit and a specific ratio of the content of the alkenyl groups, the linear polysiloxane and the second silicone resin to provide the silicone resin film with an efficient thermal softening property to fully encapsulate the chip without gas trapped after thermal pressing process. Therefore, the present film will not stick to the manufacturing machine. Furthermore, the silicone resin film has good hardness to prevent the chip from being damaged or fractured when cutting. Thus, the manufacture process is enhanced.

For imparting the silicone resin film with both a hardness and thermal softening properties, in the curable composition, the average composition formula of the first silicone resin comprises at least $R^1SiO_{3/2}$ unit and $R^2_2SiO_{2/2}$ unit, wherein the $R^1SiO_{3/2}$ unit is present at a molar ratio of 0.60 to 0.75 in the average composition formula and preferably at a molar ratio of 0.65 to 0.70, and the molar ratio of the alkenyl group bonded to silicon atom to all the function groups bonded to silicon is from 0.03 to 0.15 and preferably is from 0.07 to 0.12.

Both the molar ratio of the $R^1SiO_{3/2}$ unit in the first silicone resin and the molar ratio of the alkenyl groups bonded to the silicon atoms to all the functional groups bonded to silicon atoms are in the above-mentioned range, the silicone resin film prepared by the present curable resin composition is imparted improved thermal softening and high hardness with beneficial flexibility. These properties of the present silicone resin film are advantageous to the thermal compression process for being fully encapsulated the chip without, gas trapped and not sticking to the manufacturing machine. Furthermore, the silicone resin film has good hardness to prevent the chip from being damaged or fractured when cutting.

The average composition formula of the first silicone resin comprises at least $R^1SiO_{3/2}$ unit and $R^2_2SiO_{2/2}$ unit, wherein $R^1$ and $R^2$ are independently substituted or unsubstituted alkyl groups, substituted or unsubstituted alkenyl groups or substituted or unsubstituted aryl groups. The substituted aryl group can be substituted by for example phenyl, tolyl, xylyl or naphthyl, and preferably by phenyl. The substituted alkenyl group can be substituted by for example ethenyl propenyl, allyl, butenyl, pentenyl or hexenyl. In addition to the above-mentioned substituted or unsubstituted aryl groups and the substituted or unsubstituted alkenyl, tire other functional groups bonded to the silicon atom can be substituted or unsubstituted alkyl group. The substituted alkyl group can be substituted by for example methyl, ethyl propyl, isopropyl, butyl, isobutyl, tert-butyl, pentyl, neopentyl, hexyl, cyclohexyl, octyl, nonyl or decyl, and preferably, by methyl.

For enhancing the heat-resistance, hardness and the refraction of the silicone resin film, in the average composition formula of the first silicone resin, the molar ratio of the aryl groups bonded to silicon atom to the all functional groups bonded to the silicon atom, excluding the end-cap functional groups, is at least 0.48.

In the curable silicone resin composition for manufacturing the silicone resin film, the amount of the first silicone resin is in the range of about from 40 to 55 parts by weight and preferably is in the range of about from 40 to 50 parts by weight. When the addition amount of the first silicone resin is higher than the above range, the hardness of the manufactured silicone resin film will be too high to cause cracking. When the amount of the first silicone resin is lower than the range, the mechanic strength of the silicone resin film will be decreased and hardness thereof is not sufficient.

For obtaining desired processing and mechanical properties, the weight average molecular weight of the first silicone resin is about 500 to 200,000 and preferably is about 1,000 to 190,000.

In an embodiment of the present disclosure, the average composition formula of the first silicone resin can be represented as $(PhSiO_{3/2})_{0.7}(Me_2SiO_{2/2})_{0.2}(ViMeSiO_{2/2})_{0.1}$ and end-capped with $ViMe_2SiO_{1/2}$ unit, wherein Ph is phenyl group. Me is methyl group and Vi is vinyl group.

In another embodiment of the present disclosure, the average composition formula of the first silicone resin can be represented as $(PhSiO_{3/2})_{0.7}(Me_2SiO_{2/2})_{0.15}(ViMeSiO_{2/2})_{0.15}$ and end-capped with $ViMe_2SiO_{1/2}$ unit.

In a further embodiment of the present disclosure, the average composition formula of the first silicone resin can be represented as $(PhSiO_{3/2})_{0.65}(M_{32}SiO_{2/2})_{0.2}(ViMeSiO_{2/2})_{0.15}$ and end-capped with $ViMe_2SiO_{1/2}$ unit.

Furthermore, in the curable silicone resin composition for forming the silicone resin film, the use of the linear polysiloxane is for improving the processing of silicone resin of the first silicone resin and second silicone resin and enhancing the flexibility of the silicone resin film obtained.

The average composition formula of the linear polysiloxane comprises at least an aryl groups bonded to a silicon atom and an alkenyl group bonded to two silicon atoms. The aryl group can be an aryl group substituted or unsubstituted by such as, phenyl, tolyl, xylyl or naphthyl and preferably by phenyl. The alkenyl groups can be substituted or unsubstituted alkenyl groups such as vinyl, propenyl, allyl, butenyl, pentenyl or hexenyl and preferably by vinyl group, in addition to the aryl group and the alkenyl group, the groups that can be bonded to silicon atoms are substituted or unsubstituted alkyl groups. The substituted alkyl groups can be substituted by such as methyl, ethyl, propyl, isopropyl, butyl, isobutyl, tert-butyl pentyl neopentyl, hexyl, cyclohexyl octyl, nonyl or decyl, preferably by methyl.

For enhancing the heat-resistance, hardness and the refraction of the silicone resin film, in the average composition formula of the linear polysiloxane, the molar ratio of the aryl groups bonded to silicon atom to the all functional groups bonded to the silicon atom, excluding the end-cap functional groups, is at least 0.4.

Furthermore, in the curable silicone resin composition for manufacturing the silicone resin film, the addition amount of the first silicone resin is in the range of about from 10 to 25 parts by weight and preferably is in the range of about from 14 to 20 parts by weight. When the addition amount of the first silicone resin is higher than the above range, the hardness of the curable silicone resin is reduced and the silicone resin film thus obtained will deform when cutting and stick to cutter. When the addition amount of the first silicone resin is lower than the above range, the flexibility of the silicone resin film thus obtained will be reduced to be easily caused cracking during processing.

In particularly, the viscosity of the linear polysiloxane at 25° C. is not restricted but the preferably is in the range of about 6,000 mPa·s to about 10,000 mPa·s. If the viscosity of the linear polysiloxane is too high, the processing and the mechanical strength of the curable silicone resin composition will be reduced. If the viscosity of the linear polysiloxane is too low to adversely affect the processing and the flexibility of the resin composition.

For obtaining desired processing and mechanical properties, the weight average molecular weight of the linear polysiloxane is about 1,000 to 200,000 and preferably is about: 1,000 to 160,000. This weight average molecular weight is measured by GPC (Gel Permeation Chromatography) polystyrene standard. All the weight average molecular weights mentioned in this disclosure are measured by this method.

In a preferred embodiment of the present disclosure, the average composition formula of the linear polysiloxane is represented as $(PhMeSiO_{2/2})_{0.8}(Me_2SiO_{2/2})_{0.1}(ViMeSiO_{2/2})_{0.1}$ and end-capped with $ViMe_2SiO_{1/2}$ unit, wherein Ph is phenyl group, Me is methyl group and Vi is vinyl group. In this example of the present disclosure, the viscosity of the linear polysiloxane at 25° C. is about 6420 mPa·s.

In the curable silicone resin composition for forming a silicone film, the average unit structure of the second silicone resin is represented by a monomer having at least $R^3SiO_{3/2}$ and $R^4_3SiO_{1/2}$, wherein $R^3$ is a substituted or unsubstituted aryl group, substituted or unsubstituted alkyl group or substituted or unsubstituted alkenyl. $R^4$ is a substituted or unsubstituted aryl group, a substituted or unsubstituted alkyl group or substituted or a unsubstituted alkenyl. The substituted aryl groups can be substituted by, for example, phenyl, tolyl, xylyl or naphthyl, and preferably by phenyl. The substituted alkenyl can be substituted by for example ethenyl, propenyl, allyl, butenyl, pentenyl or hexenyl and preferably by ethenyl. In addition to the above-mentioned substituted or unsubstituted aryl groups and the substituted or unsubstituted alkenyl, the other functional groups bonded to the silicon atom can be substituted or unsubstituted alkyl group. The substituted alkyl group can be substituted by for example methyl, ethyl, propyl, isopropyl, butyl, isobutyl, tert-butyl, pentyl, neopentyl, hexyl, cyclohexyl, octyl, nonyl or decyl, and preferably, by methyl.

For enhancing the heat-resistance, hardness and the refraction of the silicone resin film, in the second silicone resin of the curable silicone resin composition, the molar ratio of the aryl groups bonded to silicon atom to the all functional groups bonded to the silicon atom, excluding the end-cap functional groups, is at least 0.25.

Furthermore, in the curable silicone resin composition for manufacturing the silicone resin film, the addition amount of the second silicone resin is in the range of about from 15 to 30 parts by weight and preferably is in the range of about from 15 to 26 parts by weight. When the addition amount of tire second silicone resin is higher than the above range, the hardness of the curable silicone resin is too high and the silicone resin film thus obtained will be easily cracked during cutting process. When the addition amount of the second silicone resin is lower than the above range, the mechanical strength of the silicone resin film and the hardness thereof is insufficient.

For obtaining desired processing and mechanical properties, the weight average molecular weight of the second silicone resin is about 100 to 10,000 and preferably is about 500 to 5,000.

In an embodiment of the present disclosure, the average composition formula of the second silicone resin can be represented by $(PhSiO_{3/2})_{0.5}(ViMe_2SiO_{1/2})_{0.5}$, wherein Ph is phenyl group. Me is methyl group and Vi is vinyl group.

In the curable silicone resin composition for forming the silicone resin film, the polysiloxane comprising silicon-hydrogen bond is represented as $HR^5{}_2SiO(SiR^6{}_2O)_nSiR^5{}_2H$, wherein $R^5$ is substituted or unsubstituted alkyl groups or hydrogen, $R^6$ is substituted or unsubstituted aryl groups or substituted or unsubstituted alkyl groups, and n is an integer more than 0.

The above mentioned aryl groups can be substituted or unsubstituted by, for example, phenyl, tolyl, xylyl or naphthyl and preferably by phenyl. The above mentioned alkyl groups can be substituted or substituted by, for example, methyl, ethyl, propyl, isopropyl, butyl, isobutyl, tert-butyl, pentyl, neopentyl, hexyl, cyclohexyl, octyl, nonyl or decyl, preferably by methyl.

For enhancing weathering resistance, hardness and retraction, in the silicon-hydrogen-bond-containing polysiloxane of the curable silicone resin composition, the molar ratio of the aryl groups bonded to silicon atom to the all functional groups bonded to the silicon atom is at least 0.24.

In the curable silicone resin composition for forming the silicone resin film, the addition amount of the silicon-hydrogen-bond-containing polysiloxane is in the range of from about 15 to 25 parts by weight. When the addition amount of the silicon-hydrogen-bond-containing polysiloxane is higher than the above range, the hardness of the silicone resin film obtained from the curable silicone resin will be reduced. When the addition amount is lower than the above range, the cross-linking reaction of the polymerizable monomers may not be complete to leave the unreacted vinyl groups in the composition to result in the silicone resin film yellowing.

For obtaining desired processing and mechanical properties, the weight average molecular weight of the silicon-hydrogen-bond-containing polysiloxane is about 100 to 5,000 and preferably is about 100 to 1,000.

In an embodiment of the present disclosure, the average composition formula of the silicon-hydrogen-bond-containing polysiloxane can be represented as $(Ph_2SiO_{2/2})_1(HMe_2SiO_{1/2})_2$ unit, wherein Ph is phenyl group and Me is methyl group.

In the curable silicone resin composition of one embodiment of the present disclosure, the platinum group metal catalyst can be for example, platinum based catalyst, rhodium based catalyst or palladium based catalyst, and preferably is platinum based catalyst. The common used catalysts can be, for example, $H_2PtCl_6.mH_2O$, $K_2PtCl_6$, $KHPtCl_6.mH_2O$, $K_2PtCl_4$, $K_2PtCl_4.mH_2O$ or $PtO_2.mH_2O$ (m is an positive integer). The complex of these catalysts with olefin, alcohol or organopolysiloxane containing vinyl groups can be also used, for example platinum(0)-2,4,6,8-tetramethyl-2,4,6,8-tetravinylcyclotrasiloxane complex solution or Platinum-Octanal/Octanol complex, but not limited to these compounds. These platinum group metal catalysts can be used alone or in combination. The addition amount of the platinum group metal catalyst is in the range of about 1 ppm to 50 ppm on the total weight of the linear polysiloxane, the first silicone resin, the second silicone resin and the silicon-hydrogen-bond-containing polysiloxane and preferably is in the range of about 3 ppm to about 10 ppm.

In one of the embodiments of the present disclosure, the platinum group metal catalyst is Platinum-Octanal/Octanol complex. The addition amount of the catalyst is about 4.3 ppm on the basis of the total weight of the linear polysiloxane, the first silicone resin, the second silicone resin and silicon-hydrogen-bond-containing polysiloxane.

The phosphor compound, used in the curable silicone resin composition of the present silicone resin film, is for adjusting the color of the light emitted by LED. A various of phosphor compounds can be used for meeting the light color requests, for example, YAG phosphor compound $(Y_3Al_5O_{12}:Ce)$, aluminate, silicate, phosphate, sulfur compound, nitride and oxynitride.

In an embodiment of the present disclosure, the addition amount of the phosphor compound is about 1 part, by weight to 300 parts by weight per 100 parts by weight of the total weight of the linear polysiloxane, the first silicone resin, the second silicone resin and silicon-hydrogen-bond-containing polysiloxane.

The curable silicone resin composition of the present silicone resin film can further comprises a bonding agent, a thixotropic agent, an inhibitor, an anti-settling agent, inorganic fillers or the combinations thereof.

The bonding agent is used for enhancing the adhesion between the silicone resin film and the frame or substrate. The bonding agent can be, for example, triallyl isocyanurate, 1,3,5-triglycidyl-S-triazinetrione, 1,3,5-tris(3-(trimethoxysilyl)propyl)isocyanurate), 1,3,5-tris(3-(trimethoxysilyl)propyl)-1,3,5-triazine-2,4,6(1H,3H,5H)-trione or the similar organosiloxane-modified isocyanurate, epoxypropoxypropyl-trimethoxy silane, 3,4-epoxycyclohexyletyl) trimethoxy silane, 3-glycidyloxypropyltriethoxy silane, 1,1,3,3-tetramethyl-1,3-bis(3-(oxiranylmethoxy)propyl)disiloxane or the like organosiloxane-modified epoxy compounds. The bonding agents mentioned above can be used alone or in combination. The addition amount of the bonding agents is about 0.1 parts by weight to 3 parts by weight per 100 parts by weight of the total weight of the linear polysiloxane, the first silicone resin, the second silicone resin and the silicon-hydrogen-bond-containing polysiloxane, and preferably is 0.1 parts by weight to 1.0 part by weight.

In an embodiment of the present disclosure, the bonding agent is 1,3,5-tris(3-(trimethoxsilylpropyl)isocyanurate) and the addition amount thereof is about 0.6 parts by weight per 100 parts by weight of the total weight of the linear polysiloxane, the first silicone resin, the second silicone resin and the silicon-hydrogen-bond-containing polysiloxane.

The inhibitor is used for extending the shelf lives of the silicone resin film. The inhibitors can be for example, 1-ethynyl-cyelohexanol, 2-methyl-3-butyn-2-ol, 3,5-dimethyl-1-hexyn-3-ol, 2-phenyl-3-butyn-2-ol or the likes, 3-methyl-3-pentene-1-yne, 3,5-dimethyl-3-hexene-1-yne or the similar enyne compounds. The addition amount of the inhibitor is about 100 ppm to 2,000 ppm per 100 parts by weight of total weight of the linear polysiloxane, the first silicone resin, the second silicone resin and the silicon-hydrogen-bond-containing polysiloxane and preferably is about 500 ppm to 1,500 ppm.

In an embodiment of the present disclosure, 1-acetylene cyclohexanol is used as the inhibitor and is added in an amount of 1,000 ppm per 100 parts by weight of the linear polysiloxane, the first silicone resin, the second silicone resin and silicon-hydrogen-bond-containing polysiloxane.

The thixotropic agent is used to enhance and stabilize the thixotropy of the present silicone resin film. The thixotropic agent can be, for example, BYK®-405, BYK®-R 605 or BYK®-R 606 commercially available from BYK-Chemie GmbH.

The inorganic filler used in the present silicone resin film is for improving the heat-resistance of the film and is used as an anti-settling agent for the phosphor compound. Furthermore, the inorganic fillers can be used as reflective particles. The inorganic fillers can be reinforcing fillers, such as fumed silicate or fumed titania or non-reinforcing fillers, such as calcium carbonate, calcium silicate, titanium dioxide, titanium oxide, zinc oxide.

In an embodiment of the present disclosure, the curable silicone resin composition of the present silicone resin film comprises fumed silica, the addition amount of the fumed silica is from about 0.1 part by weight to about 5 parts by weight per 100 parts by weight of the total weight of the linear polysiloxane, the first silicone resin, the second silicone resin and silicon-hydrogen-bond-containing polysiloxane.

The present silicone resin film provides an efficient thermal softening property, that is the minimum storage modulus (G') of the silicone resin film at the temperature of 100° C. to 160° C. is $1.0 \times 10^2$ to $9.9 \times 10^4$, and preferably is $1.0 \times 10^2$ to $9.9 \times 10^3$. In the present disclosure, the loss modulus/ storage modules is represented as tan δ. In accordance with an embodiment of the present disclosure, the maximum tan δ of the silicone resin film at the temperature of 100° C. to 160° C. is between 0.5 to 2.5 and preferably is between 1 and 2. Therefore, the present silicone resin film can be deformed with the shapes and configurations of the substrate and the chip after heating so as to folly encapsulate the chip without gas trapped. Furthermore, the present film will not stick to the manufacturing machine. Thus, the production yield can be improved.

In one embodiment of the method for manufacturing the present silicone resin film, the curable silicone resin composition is coated on the release substrate and cured to form a silicone resin coating layer. For the purpose of protection of the silicone resin coating, the surface of the coating can be adhered to a release substrate.

The coating method used in the present disclosure can be the method well known by the skilled artisan in the related art, such as, be for example, a dip coating method, a slit coating method, a roller coating method, a batch coating method, and a spin coating method, but is not limited thereto.

The release substrate can be, for example, polyethylene terephthalate (PET), polyethylene, polypropylene, flouring-containing polyethylene terephthalate or flouring-containing resin film. The thickness of the release substrate can be from 1 μm to 300 μm, preferably is front 25 μm to 150 μm, but is not limited thereto.

The thickness of the silicone resin coating layer coated on the re lease substrate is about 1 um to 500 um, preferably is about 10 um to 300 um and more preferably is about 50 um to 100 um. The thickness of the silicone resin coating can be various to meet the desired particular properties of the semiconductor devices.

The cure condition is at temperature from 80° C. to 140° C. from 10 minutes to 100 minutes. According to the types and components of the semiconductor devices to be encapsulated, the cure condition can be adjusted.

The present disclosure is to provide an optical semiconductor device, wherein the optical semiconductor device is encapsulated by the present disclosed silicone resin film.

Furthermore, the present disclosure is to provide a method for encapsulating an optical semiconductor device. The encapsulation method comprises the steps of placing the silicone resin film as claimed in any one of claims 1 to 12 on a semiconductor device, thermal compressing the film and device, and peeling away the release substrate.

After the release substrate of the silicone resin film is peeled away, the encapsulated optical semiconductor devices can be performed a second thermal compression for more tightly sealed the silicone resin film and the optical semiconductor devices.

The thermal compression can be performed at 30° C. to 120° C. for 1 second to 100 seconds. The thermal compression can be performed with a suction device for increasing the seal between the softening silicone resin film and the chip in order to improve the efficiency of the chip encapsulation.

Furthermore, the present silicone resin film can pretreated by, such as, heating to the temperature of 50° C. to 60° C. for 5 to 10 minutes before the conduction of thermal compression.

The present disclosure provides a curable silicone resin composition. The present curable silicone resin composition comprises 10 to 25 parts by weight of a linear polysiloxane, the average composition formula of the linear polysiloxane having at least one aryl group bonded to a silicon atom and two alkenyl groups bonded to a silicon atom; 40 to 55 parts by weight of a first silicone resin, wherein the average composition formula of the first silicone resin comprises at least a $R^1SiO_{3/2}$ unit and a $R^2{}_2SiO_{2/2}$ unit, wherein $R^1$ and $R^2$ are independently substituted or unsubstituted alkyl groups, substituted or unsubstituted alkenyl groups or substituted or unsubstituted aryl groups, the molar fraction of $R^1SiO_{3/2}$ unit is between 0.60 to 0.75 in the average composition formula of the first silicone resin, the molar ratio of the alkenyl groups bonded to the silicon atoms to all the functional groups bonded to silicon atoms is between 0.03 to 0.15; 15 to 30 parts by weight of a second silicone resin, wherein the average composition formula of the second silicone resin comprises at least a $R^3SiO_{3/2}$ unit and $R^4{}_3SiO_{1/2}$ unit, wherein $R^3$ and $R^4$ independently are substituted or unsubstituted alkyl groups, substituted or unsubstituted alkenyl groups or substituted or unsubstituted aryl groups; 15 to 25 parts by weight of polysiloxane having silicon-hydrogen bonding of the formula: $HR^5{}_2SiO(SiR^6{}_2O)_nSiR^5{}_2H$, wherein $R^5$ is a substituted or unsubstituted alkyl group or hydrogen, $R^6$ is a substituted or unsubstituted aryl group, or a substituted or unsubstituted alkyl group, n is an integer more than 0; a platinum group metal catalyst and a phosphor compound.

In accordance with an embodiment of the curable silicone resin composition of the present disclosure, in the average composition formula of the linear polysiloxane, the molar ratio of the aryl groups bonded to silicon atoms to the all functional groups bonded to the silicon atoms, excluding the end-cap functional groups, is at least 0.4.

In accordance with an embodiment of the curable silicone resin composition of the present disclosure, in the average composition formula of the first silicone resin, the molar ratio of the aryl groups bonded to silicon atoms to the all functional groups bonded to the silicon atoms, excluding the end-cap functional groups, is at least 0.48.

In accordance with an embodiment of the curable silicone resin composition of the present disclosure, in the average composition formula of the second silicone resin, the molar ratio of the aryl groups bonded to silicon atoms to the all functional groups bonded to the silicon atoms, excluding the end-cap functional groups, is at least 0.25.

In accordance with an embodiment of the curable silicone resin composition of the present disclosure, the curable silicone resin composition comprises 1 ppm to 50 ppm of platinum group metal catalyst per 100 parts by weight of the total amount of the linear polysiloxane, the first silicone resin, the second silicone resin and the silicon-hydrogen-bonding containing polysiloxane.

In accordance with an embodiment of the curable silicone resin composition of the present disclosure, the curable silicone resin composition comprises 1 to 300 parts by weight of the phosphor compound per 100 parts by weight of the total amount of the linear polysiloxane, the first silicone resin, the second silicone resin and the silicon-hydrogen-boding containing polysiloxane.

In accordance with an embodiment of the present disclosure, the curable silicone resin composition can further comprises a bonding agent, an inhibitor, a thixotropic agent, an anti-settling agent, inorganic fillers or the combinations thereof.

In accordance with an embodiment of the curable silicone resin composition of the present disclosure, the inorganic filler used in the curable silicone resin composition can be fumed silica. The additional amount of fumed silica is 0.1 to 5 parts by weight based on 100 parts by weight of the total amount of the linear polysiloxane, the first silicone resin, the second silicone resin and the silicon-hydrogen-bonding containing polysiloxane.

The above-mentioned curable silicone resin composition can be used to form the present silicone resin film.

According to an aspect of the present disclosure, an optical semiconductor device is provided, wherein the semiconductor device is encapsulated by the silicone resin film prepared by the present curable resin composition.

The present silicone resin film will be determined by the test methods as below. The results are shown in table 2.

Refraction index: measuring at wavelength of 589 nm at temperature of 20° C. by Abbe refractometer (ATAGO-DR-A1).

Hardness: determining the hardness of silicone resin film by Shore Hardness test of ASTMD2240.

Storage modulus (G') and tan δ (loss modulus/storage modulus): determining the minimum storage modulus (G') aid maximum tan δ by conducting a Theological tests on the silicone resin film from the initial temperature of 25° C. to 180° C. at a increating rate of 25° C./min under the normal force of 0 N by Advanced Rheometer 2000).

Chip encapsulation: determining the encapsulation performance by the method of placing the silicone resin film on the LED chip, thermal compressing at the temperature of 30° C. to 50° C. for 20 to 100 seconds, and peeling away the release substrate, thermal compressing again at the temperature of 60° C. to 100° C. for 1 to 20 seconds to complete the encapsulation. The appearance of the encapsulated LED chip was imaged by optical microscopy. 「○」represents no gas trapped and no chip appeared, 「×」represents gas trapped or chip appeared.

The preparation methods of the components of the present silicone resin film are described as below.

Preparation Example 1—Preparation of the Linear Polysiloxane (Compound 1)

3499.92 g (19.13 moles) of phenylmethyl dimethoxysilane (commercially available from Chembidge Mentation Corp (Chembridge), Taiwan), 288.48 g (2.4 moles) of dimethydimethoxysilane (commercially available from Chembidge, Taiwan), and 317.28 g (2.4 moles) of methylvinyldimethoxysilane (commercially available from Union Chemical Ind. Co., Ltd. (Union), Taiwan) were added to a reaction tank and mixed by stirring at ambient temperature to a homogenous solution. The mixed solution was dropped into a 5% aqueous sulfuric acid solution (5337.4 g) to obtain a reaction solution. Next, the reaction solution was heated to 75° C. to conduct a hydrolysis reaction. After the hydrolysis reaction was completed, the organic phase was extracted by deionic water to reach a neutral state and then removed the organic solvent to obtain a hydrolysis product.

The hydrolysis product 69.52 g (0.374 mole) of divinyltetramethyldisiloxane (commercially available from Union) and 5.88 g of tetramethyl ammonium hydroxide (brand name LG9658, commercially available from Alfa Aesar, USA) were placed into a reaction tank. Nitrogen was fed into the reaction tank and the mixture was stirred at ambient temperature to obtain a reaction solution. The reaction solution was heated to 95° C. After the reaction was completed, the reaction solution was conducted an alkaline removing to complete the preparation of Compound 1. The average composition formula of the Compound 1 is $(PhMeSiO_{2/2})_{0.8}(Me_2SiO_{2/2})_{0.1}(ViMeSiO_{2/2})_{0.1}$ with end-cap unit $ViMe_2SiO_{1/2}$, wherein Ph represents phenyl group, Me represents methyl group and Vi represents vinyl group.

Preparation Example 2—The Preparation of the Linear Polysiloxane (Compound 2)

2685 g (13.5 mole) of phenyl-trimethoxysilane (commercially available from Union), 349 g (2.9 moles) of dimethyl dimethoxysilane (commercially available from Chembridg), and 384 g (2.9 moles) of methylvinyldimethoxysilane (commercially available from Union, Taiwan) were placed in a reaction, tank. The mixture was stirred at ambient temperature to obtain a homogenous solution. The mixed solution was dropped into 5% aqueous sulfuric acid solution (4579 g) to prepare a reaction solution. Then, this reaction solution was heated to 75° C. to conduct a hydrolysis reaction. After the reaction completed, the organic phase was extracted by deionized acid and moved the solvent to obtain a hydrolysis product.

The hydrolysis product, 21.39 g (0.11 moles) of divinyltetramethyldisiloxane (commercially available from Union), 22.74 g of potassium hydroxide and 2274 g of toluene were placed into a reaction tank. Nitrogen was fed into the reaction tank and the mixture was stirred at ambient temperature to obtain a reaction solution. Next, the reaction solution was heated to 95° C. After the reaction was completed, the organic phase was extracted by deionized water until the organic phase reached neutral, and then removed the solvent to obtain Compound 2. The average composition formula of Compound 2 was $(PhSiO_{3/2})_{0.7}(Me_2SiO_{2/2})_{0.15}(ViMeSiO_{2/2})_{0.15}$ with end-cap unit $ViMe_2SiO_{1/2}$.

Preparation Example 3—Preparation of the Linear Polysiloxane (Compound 3)

2776 g (14 moles) of phenyl-trimethoxysilane (commercially available from Unions Taiwan), 480.88 g (4 moles) of dimethyldimethoxysilane, commercially available from Chembridge), and 264.46 g (2 moles) of methylvinyldimethoxysilane (commercially available from Union) were placed into a reaction tank. The mixture was stirred at ambient temperature until obtaining a homogenous solution. The mixed solution was dropped into 5% aqueous sulfuric acid solution to prepare a reaction solution. Then, this mixture solution was heated to 75° C. to conduct hydrolysis. After the reaction was completed, the organic phase was extracted by de ionized water until the organic phase reached neutral and next, removed solvent to obtain a hydrolysis product.

The hydrolysis product, 21.39 g (0.11 mole) of divinyltetramethyldisiloxane (commercially available from Union), 22.74 g of potassium hydroxide and 2274 g of toluene were placed into a reaction tank. Nitrogen was fed into the reaction tank and the mixture was stirred at ambient temperature to prepare a reaction solution. Then, the reaction solution was to 95° C. After the reaction was completed, the organic phase was extracted by deionized water until the organic phase reached neutral and then, the solvent was removed to obtain Compound 3. The average composition formula of Compound 3 is $(PhSiO_{3/2})_{0.7}(Me_2SiO_{2/2})_{0.2}(ViMeSiO_{2/2})_{0.1}$ with end-cap unit $ViMe_2SiO_{1/2}$.

Preparation Example 4—Preparation of the Linear Polysiloxane (Compound 4)

2578 g (13 moles) of phenyl-trimethoxysilane (commercially available from Union), 481 g (4 moles) of dimethyldimethoxysilane (commercially available from Chembridge), and 397 g (3 moles) of methylvinyldimethoxysilane (commercially available from Union, Taiwan) were placed into a reaction tank. The mixture was stirred at ambient temperature to prepare a homogenous solution. The mixed solution was dropped into 5% aqueous sulfuric acid solution to prepare a reaction solution. Then, this mixture solution was heated to 75° C. to conduct hydrolysis. After the reaction was completed, the organic phase was extracted by deionized water until the organic phase reached neutral and next, removed solvent to obtain a hydrolysis product.

The hydrolysis product, 21.39 g (0.11 moles) of divinyltetramethyldisiloxane (commercially available from Union), 22.74 g of potassium hydroxide and 2274 g of toluene were placed in a reaction tank. Nitrogen was fed into the reaction tank and the mixture was stirred at ambient temperature to prepare a reaction solution. Then, the reaction solution was to 95° C. After the reaction was completed, the organic phase was extracted by deionized water until the organic phase reached neutral and then, the solvent was removed to obtain Compound 4. The average composition formula of the Compound 4 is $(PhSiO_{3/2})_{0.65}(Me_2SiO_{2/2})_{0.2}(ViMeSiO_{2/2})_{0.15}$ with end-cap unit $ViMe_2SiO_{1/2}$.

Preparation Example 5—Preparation of the Linear Polysiloxane (Compound 5)

2379.4 g (12 moles) of phenyltrimethoxysilane, commercially available from Union), and 1118.4 g (6 moles) of divinyltetramethyldisiloxane (commercially available from Union) were placed into a reaction tank. The mixture was stirred at ambient temperature until obtaining a homogenous solution. The mixed solution was dropped into 5% aqueous sulfuric acid solution (4547.16 g) to prepare a reaction solution. Then, this mixture solution was heated to 75° C. to conduct hydrolysis. After the reaction was completed, the organic phase was extracted by deionized water until the organic phase reached neutral and next, removed solvent to obtain a hydrolysis product.

The hydrolysis product, 1998 g of toluene and 10 g of potassium hydroxide were placed into a reaction tank. Nitrogen was fed into the reaction talk and the mixture was stirred at ambient temperature to prepare a reaction solution. Then, the reaction solution was heated to 85° C. After the reaction was completed, the organic phase was extracted by deionized water until the organic phase reached neutral and then, the solvent was removed to obtain Compound 5. The average composition formula of the Compound 5 is $(PhSiO_{3/2})_{0.5}(ViMe_2SiO_{1/2})_{0.5}$.

Preparation Example 6—Preparation of the Linear Polysiloxane (Compound 6)

3432.04 g (14 moles) of diphenyldimethoxysilane (commercially available from Union), and 1880.62 g (14 moles) of 1,1,3,3-Tetramethyldisiloxane (commercially available from Chembridge) were placed in to a reaction tank and stirred at ambient temperature to obtain a homogenous solution. The mixed solution was dropped into a 50% aqueous sulfuric acid solution (2669 g) to prepare a reaction solution. Then, the reaction solution stands for 4 hours to conduct hydrolysis. Alter the reaction was completed, the organic phase was extracted by deionized water until the organic phase reached neutral and then, the solvent was removed to obtain Compound 6. The average composition formula of the Compound 6 is $(Ph_2SiO_{2/2})_1(HMe_2SiO_{1/2})_2$.

The method for preparing the silicon resin film in Example 1 to Example 5 is described as below, the detail compositions thereof can be referred to table 1.

Example 1

Firstly, 40 g of Compound 3, 25.7 g of Compound 5, 20 g of Compound 6, 1000 ppm (based on 100 g of Compound 1, Compound 3, Compound 5 and Compound 6) of 1-ethynyl-cyclohexanol (Product No. 119105000, commercially available from Acros) as an inhibitor, 0.6 wt % (based on 100 g of Compound 1, Compound 3, Compound 5 and Compound 6) of Tris(3-trimethoxysilylpropyl)isocyanurate (Product No. 440825, commercially available from Sigma-Aldrich) as a bonding agent, and 1.5 parts by weight of fumed silica (brand name TS-720, commercially available from Cabot Corp., USA) were placed into a reaction vessel to prepare a first solution. Into another reaction vessel, 14.3 g of Compound 1, and 4.3 ppm (based on 100 g of Compound 5, Compound 3, Compound 5 and Compound 6) of platinum-octanal/octanol complex (commercially available from Gelest, USA) were placed to prepare a second solution. The first solution, the second solution and 100 g of a phosphor compound (brand name as NYAG4454-EL, commercially available from intematix Corporation, USA) were mixed and stirred thoroughly at ambient temperature, and then coated on a first release substrate. The coating was next cured to a silicone resin coating to obtain a silicone resin film. The cure temperature was 90° C. and the cure time was 80 minutes. Then, the surface of the cured silicone resin coating of the silicone resin film was adhered to another one release substrate.

Example 2

40 g of Compound 3.20 g of Compound 5, 20 g of Compound 6 and 1000 ppm (based on 100 g of Compound 1, Compound 3, Compound 5 and Compound 6) of 1-ethynyl-cyclohexanol (brand name as 119105000, commercially available from Acros) as an inhibitor, 0.6 wt % (based on 100 g of Compound 1, Compound 3, Compound 5 and Compound 6) of tris(3-trimethoxysilylpropyl)isocyanurate (product No. 440825, commercially available from Sigma-Aldrich) as a bonding agent, and 1.5 g of fumed silica (product No. TS-720, commercially available from Cabot) were placed into a reaction vessel to prepare a first solution. Into another reaction vessel, 20 g of Compound 1, and 4.3 ppm (based on 100 g of Compound 1, Compound 3, Compound 5 and Compound 6) of platinum-octanal/octanol complex (commercially available from Gelest, USA) to prepare a second solution. The first solution, the second solution and 100 g of phosphor compound (Product No. NYAG4454-EL, commercially available from Intematix) were mixed and stirred thoroughly at ambient temperature and then coated on a first release substrate. The coating was next cured to form a cured silicone resin coating to obtain a silicone resin film. The cure temperature was 90° C. and cure time was 35 minutes. Then, the surface of the cured silicone resin coating of the silicone resin film was adhered to another one release substrate.

Example 3

Firstly, 40 g of Compound 4, 25.7 g of Compound 5, 20 g of Compound 6, 1000 ppm (based on 100 g of Compound 1, Compound 4, Compound 5 and Compound 6) of 1-ethynyl-cyclohexanol (Product No. 119105000, commercially available from Acros) as an inhibitor, 0.6 wt % (based on 100 g of Compound 1, Compound 4, Compound 5 and Compound 6) of tris(3-trimethoxysilylpropyl)isocyanurate (Product No. 440825, commercially available from Sigma-Aldrich) as a bonding agent, and 1.5 g of fumed silica (Product No. TS-720, commercially available from Cabot. Corp., USA) were placed into a reaction vessel, to prepare a first solution. 14.3 g of Compound 1, and 4.3 ppm (based on 100 g of Compound 1, Compound 4, Compound 5 and Compound 6) of platinum-octanal/octanol complex (commercially available from Gelest, USA) were placed in another reaction vessel to form a second solution. The first solution, the second solution and 100 g of phosphor compound (Product No. NYAG4454-EL, commercially available from Intematix Corp., USA) were mixed and stirred thoroughly at ambient temperature. The mixture was coated on a first release substrate and cured to a silicone resin coating to form a silicone resin film. The cure temperature was 110° C. and cure time was 100 minutes. Then, the surface of the cured silicone resin coating of the silicone resin film was adhered another one release substrate.

Example 4

Firstly, 40 g of Compound 2, 25.7 g of Compound 5, 20 g of Compound 6, 1000 ppm (based on 100 g of Compound 1, Compound 2, Compound 5 and Compound 6) of 1-ethynyl-cyclohexanol (Product No. 119105000, commercially available from Acros) as an inhibitor, 0.6 wt % (based on 100 g of Compound 1, Compound 2, Compound 5 and Compound 6) of tris(3-trimethoxysilylpropyl)isocyanurate (Product No. 440825, commercially available from Sigma-Aidrich) as a bonding agent, and 1.3 g of fumed silica (Product No. TS-720, commercially available from Cabot Corp., USA) were placed in a reaction vessel to form a first solution. 14.3 g of Compound 1, and 43 ppm (based on 100 g of Compound 1, Compound 2, Compound 5 and Compound 6) of Platinum-Octanal/Octanol Complex (commercially available from Gelest, USA) were placed in another reaction vessel to form a second solution. The first solution, the second solution and 100 g of phosphor compound (Product Mo. NYAG4454-EL, commercially available from Intematix Corporation) were mixed and stirred at ambient temperature. The mixture was coated on a first release substrate and cured to a silicone resin coating to form a silicone resin film. The cure temperature was 110° C. and the cure time was 80 minutes. Then, surface of the silicone resin coating of the silicone resin film is adhered to another one release substrate.

Example 5

47.3 g of Compound 2, 18.4 g of Compound 5, 20 g of Compound 6, 1000 ppm (based on 100 g of Compound 1, Compound 2, Compound 5 and Compound 6) of 1-ethynyl-cyelohexanol (Product No. 119105000, commercially available from Acros) as an inhibitor, 0.6 wt % (based on 100 g of Compound 1, Compound 2, Compound 5 and Compound 6) of tris(3-trimethoxysilylpropyl)isocyanurate (Product No. 440825, commercially available from Sigma-Aldrich) as a bonding agent and 1.5 g of fumed silica (Product No, TS-720, commercially available from Cabot Corp., USA) were placed in a reaction vessel to form a first solution. 14.3 parts by weight of Compound 1, and 4.3 ppm (based on 100 g of Compound 1, Compound 2, Compound 5 and Compound 6) of Platinum-Octanal/Octanol Complex (commercially available from Gelest, USA) were placed in another reaction vessel to from a second solution. The first solution, the second solution and 100 g of phosphor compound (Product No. NYAG4454-EL, commercially available from Intematix, USA) were mixed and stirred thoroughly at ambient temperature. The mixture was coated on a first release substrate and cured to a silicone resin coating for forming a silicone resin film. The cure temperature was 105° C. and the cure time was 80 minutes. Then, surface of the silicone resin coating of the silicone resin film is adhered to another one release substrate.

TABLE 1

The compositions of Example 1 to Example 5

| | Example | | | | |
|---|---|---|---|---|---|
| | 1 | 2 | 3 | 4 | 5 |
| Linear polysiloxane (g) | 14.3 | 20 | 14.3 | 14.3 | 14.3 |
| First silicon resin (PhSiO$_{3/2}$)$_{0.7}$(Me$_2$SiO$_{2/2}$)$_{0.15}$(ViMeSiO$_{2/2}$)$_{0.15}$ (g) | — | — | — | 40 | 47.3 |
| (PhSiO$_{3/2}$)$_{0.7}$(Me$_2$SiO$_{2/2}$)$_{0.2}$(ViMeSiO$_{2/2}$)$_{0.1}$ (g) | 40 | 40 | — | — | — |
| (PhSiO$_{3/2}$)$_{0.65}$(Me$_2$SiO$_{2/2}$)$_{0.2}$(ViMeSiO$_{2/2}$)$_{0.15}$ (g) | — | — | 40 | — | — |
| Second silicone resin (g) | 25.7 | 20 | 25.7 | 25.7 | 18.4 |
| silicon-hydrogen-bond-containing polysiloxane (g) | 20 | 20 | 20 | 20 | 20 |
| platinum group metal catalyst (ppm) | 4.3 | 4.3 | 4.3 | 4.3 | 4.3 |
| 1-ethynyl-cyclohexanol (ppm) | 1000 | 1000 | 1000 | 1000 | 1000 |
| 1,3,5-tris(3-(trimethoxysilylpropyl)isocyanurate) (wt %) | 0.6 | 0.6 | 0.6 | 0.6 | 0.6 |
| fumed silica (g) | 1.5 | 1.5 | 1.5 | 1.5 | 1.5 |
| phosphor compound (g) | 100 | 100 | 100 | 100 | 100 |

The appearance and properties of the silicone resin film obtained from Example 1 to Example 5 was listed in table 2 as below.

TABLE 2

The results of the tests of Example 1 to Example 5

| | Example | | | | |
|---|---|---|---|---|---|
| | 1 | 2 | 3 | 4 | 5 |
| Refractive index | 1.53 | 1.53 | 1.53 | 1.53 | 1.53 |
| hardness | 66D | 57D | 66D | 51D | 64D |
| tan δ | 1.4 | 1.2 | 1.4 | 1.4 | 1.6 |
| storage modulus (G') | 9.2 × 10$^2$ | 1.9 × 10$^3$ | 1.1 × 10$^3$ | 6.6 × 10$^2$ | 8.9 × 10$^2$ |
| Chip encapsulation | ○ | ○ | ○ | ○ | ○ |

As the results shown in table 2, the refractive index of Example 1 to Example 5 is up to 1.53, the hardness is 50D or more, wherein the hardness of Example 1 and Example 3 is respectively up to 66D. Furthermore, the tan δ (loss modulus/storage modulus) of Example 1 to Example 5 is 1.2 to 1.6, the storage modulus thereof is between 6.6×10$^2$ to 1.9×10$^3$. Therefore, the silicone resin films of the present disclosure have thermal softening and hardness.

Figure 2:
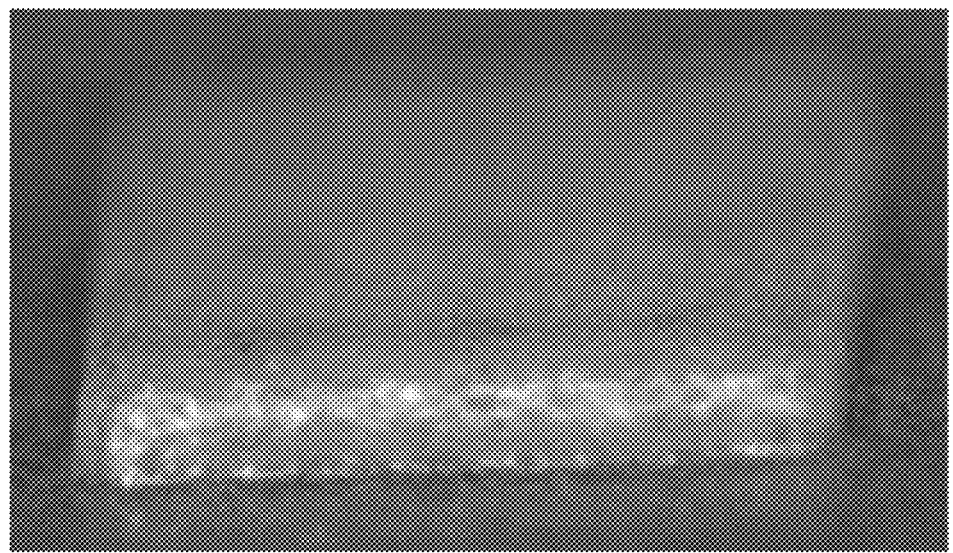
FIG. 2 is a side view optical-microscope image of a semiconductor device encapsulated by the silicone resin film obtained in Example 1.

FIG. 1 is a top view optical-microscope image of a semiconductor device encapsulated by the silicone resin film obtained in Example 1. FIG. 2 is a side view optical-microscope image of a semiconductor device encapsulated by the silicone resin film obtained in Example 1. The images of FIG. 1 and FIG. 2 illustrate when the silicone resin film disclosed in the present disclosure is used to encapsulate LED chips, no gas is trapped and the present resin film can fully encapsulate the LED chips without any chip exposed. As the results of the chip encapsulation test the silicone resin film of Example 2 to Example 5 has the results same as to the silicone resin film of Example 1 in the thermal softening property.

Although particular embodiments have been shown and described, it should be understood that the above discussion is not intended to limit the present disclosure to these embodiments. Persons skilled in the art will understand that various changes and modifications may be made without departing from the scope of tire present disclosure as literally and equivalently covered by the following claims.

What is claimed is:

1. A silicone resin film, comprising
a release substrate; and
a silicone resin coating layer coated on the release substrate, wherein the coating layer is formed by coating a curable silicone resin composition on the release substrate and cured, wherein the curable silicone resin composition comprises:
10 to 25 parts by weight of a linear polysiloxane, the average composition formula of the linear polysiloxane having at least one aryl group bonded to a silicon atom and two alkenyl groups bonded to a silicon atom;
40 to 55 parts by weight of a first silicone resin, wherein the average composition formula of the first silicone resin comprises at least a R$^1$SiO$_{3/2}$ unit and a R$^2{}_2$SiO$_{2/2}$ unit, wherein R$^1$ and R$^2$ are independently substituted or unsubstituted alkyl groups, substituted or unsubstituted alkenyl groups or substituted or unsubstituted aryl groups, the molar fraction of R$^1$SiO$_{3/2}$ unit is between 0.60 to 0.75 in the average composition formula of the first silicone resin, the molar ratio of the alkenyl groups bonded to the silicon atoms to all the functional groups bonded to silicon atoms is between 0.03 to 0.15;
15 to 30 parts by weight of a second silicone resin, wherein the average composition formula of the second silicone resin comprises at least a R$^3$SiO$_{3/2}$ unit and R$^4{}_3$SiO$_{1/2}$ unit, wherein R$^3$ and R$^4$ independently are substituted or unsubstituted alkyl groups, substituted or unsubstituted alkenyl groups or substituted or unsubstituted aryl groups;
15 to 25 parts by weight of polysiloxane having silicon-hydrogen bonding of the formula: HR$^5{}_2$SiO(SiR$^6{}_2$O)$_n$SiR$^5{}_2$H, wherein R$^5$ is a substituted or unsubstituted alkyl group or hydrogen, R$^6$ is a substituted or unsubstituted aryl group, or a substituted or unsubstituted alkyl group, n is an integer more than 0;
a platinum group metal catalyst; and
a phosphor compound.

2. The silicone resin film according to claim 1, wherein, in the average composition formula of the linear polysiloxane in the curable silicone resin composition, the molar ratio of the aryl groups bonded to silicon atoms to the all functional groups bonded to the silicon atoms, excluding the end-cap functional groups, is at least 0.4.

3. The silicone resin film according to claim 1, wherein in the average composition formula of the first silicone resin in the curable silicone resin composition, the molar ratio of the aryl groups bonded to silicon atoms to the all functional groups bonded to the silicon atoms, excluding the end-cap functional groups, is at least 0.48.

4. The silicone resin film according to claim 1, wherein in the average composition formula of the second silicone resin in the curable silicone resin composition, the molar ratio of the aryl groups bonded to silicon atoms to the all functional groups bonded to the silicon atoms, excluding the end-cap functional groups, is at least 0.25.

5. The silicone resin film according to claim 1, wherein the curable silicone resin composition comprises 1 ppm to 50 ppm of platinum group metal catalyst on the basis of 100 parts by weight of the total amount of the linear polysiloxane, the first silicone resin, the second silicone resin, and the silicon-hydrogen-bonding containing polysiloxane.

6. The silicone resin film according to claim 1, wherein the curable silicone resin composition comprises 1 to 300 parts by weight of the phosphor compound based on 100 parts by weight of the total amount of the linear polysiloxane, the first silicone resin, the second silicone resin, and the silicon-hydrogen-bonding containing polysiloxane.

7. The silicone resin film according to claim 1 further comprising a bonding agent, an inhibitor, a thixotropic agent, an anti-settling agent, inorganic fillers, or a combination thereof.

8. The silicone resin film according to claim 7, wherein the inorganic fillers comprises fumed silica.

9. The silicone resin film according to claim 8, wherein the amount of the fumed silica is 0.1 to 5 parts by weight based on 100 parts by weight of the total amount of the linear polysiloxane, the first silicone resin, the second silicone resin, and the silicon-hydrogen-bonding containing polysiloxane.

10. The silicone resin film according to claim 1, wherein the minimum storage modulus (G') of the silicone resin film at a temperature ranged from 100° C. to 160° C. is $1.0 \times 10^2$ to $9.9 \times 10^4$.

11. The silicone resin film according to claim 1, wherein the loss modulus/storage modulus of the silicone resin film at a temperature ranged from 100° C. to 160° C. is between 0.5 to 2.5.

12. The silicone resin film according to claim 1, wherein a time for curing the silicone resin coating at a temperature ranged from 80° C. to 140° C. is 10 minutes to 100 minutes.

13. An optical semiconductor device, wherein the optical semiconductor device is encapsulated by the silicone resin film claimed in claim 1.

14. A method for encapsulating an optical semiconductor device, comprising the steps of placing the silicone resin film as claimed in claim 1 on a semiconductor device, thermal compressing the film and device, and peeling away the release substrate.

* * * * *